(12) United States Patent
Fayneh et al.

(10) Patent No.: US 6,654,899 B2
(45) Date of Patent: Nov. 25, 2003

(54) TRACKING BIN SPLIT TECHNIQUE

(75) Inventors: Eyal Fayneh, Givatayim (IL); Earnest Knoll, Haifa (IL)

(73) Assignee: Intel Corporation, Santa Clara, CA (US)

( * ) Notice: Subject to any disclaimer, the term of this patent is extended or adjusted under 35 U.S.C. 154(b) by 374 days.

(21) Appl. No.: 09/818,615

(22) Filed: Mar. 28, 2001

(65) Prior Publication Data

US 2002/0144172 A1 Oct. 3, 2002

(51) Int. Cl.$^7$ .................................................. G06F 3/00
(52) U.S. Cl. ........................ 713/500; 713/400; 713/600; 710/61; 709/400
(58) Field of Search ................................. 713/500, 400, 713/501, 502, 503, 600; 709/400; 710/56, 60, 61, 117, 125; 327/157, 295

(56) References Cited

U.S. PATENT DOCUMENTS

| | | | | |
|---|---|---|---|---|
| 4,180,783 A | * | 12/1979 | Ehalifa ........................... 331/2 |
| 5,142,247 A | * | 8/1992 | Lada, Jr. et al. ............... 331/14 |
| 5,627,538 A | * | 5/1997 | Ferry ........................... 341/144 |
| 5,742,208 A | * | 4/1998 | Blazo ............................ 331/23 |
| 5,786,732 A | * | 7/1998 | Nielson ....................... 331/1 A |
| 6,025,738 A | * | 2/2000 | Masleid ........................ 326/83 |
| 6,137,336 A | * | 10/2000 | Baba et al. .................. 327/295 |
| 6,188,258 B1 | * | 2/2001 | Nakatani .................... 327/157 |

* cited by examiner

Primary Examiner—Jeffrey Gaffin
Assistant Examiner—Mai Rijue
(74) Attorney, Agent, or Firm—Antonelli, Terry, Stout & Kraus, LLP

(57) ABSTRACT

A tracking bin split technique includes: receiving an externally generated board clock and selectively generating a reference clock in phase with the externally generated board clock at a frequency equal to that of the externally generated board clock multiplied by M, wherein M is an integer equal to or greater than one; receiving the reference clock output by the clock generator and generating an output clock with a phase locked loop in phase with the reference clock and having a frequency which is an integral multiple of that of the reference clock; and receiving the output clock generated by the phase locked loop and generating a feedback clock for the phase locked loop in phase with the output clock and at a frequency equal to that of the output clock divided by 2N, wherein 2N is an even integer equal to or greater than two.

18 Claims, 5 Drawing Sheets

TRACKING BIN SPLIT TECHNIQUE

FIELD

The present invention relates to a tracking bin split technique and more particularly, the present invention relates to a tracking bin split technique for generating high frequency clocks used in processors.

BACKGROUND

In many applications, a circuit board, such as a motherboard, has a board clock generator disposed thereon. The board clock generator is used to generate clocks which are distributed to various elements mounted on the board. This insures that the elements mounted on the board operate in a substantially synchronous fashion. Quite often, certain elements, such as high-speed processors, will operate at a clock speed which is significantly higher than that of the board clock generator clocks. Accordingly, it is necessary to employ a bin split technique to produce a clock which is an integral multiple of the board clock generator clock and to distribute this clock to various elements within a processor.

FIG. 1 is a block diagram illustrating an example of a disadvantageous bin split arrangement for generating a clock output whose frequency is an integral multiple of the board clock generator clock. As shown in FIG. 1, a board clock generator 100, disposed on a motherboard, outputs a clock XCLKREF which is inputted to a core clock generator 110, contained within a processor chip, for example, disposed of the motherboard. Contained within the core clock generator 110 is a PLL (Phase Locked Loop) 120 connected to a PLL Feedback Divider (1/2N) 130 and a PLL Output Divider (1/2) 140.

The output of the PLL 120 is fed back to one input thereof via the PLL feedback divider (1/2N) 130. The PLL feedback divider (1/2N) 130 divides the frequency outputted by the PLL 120 by 2N. It the frequency of the clock outputted by the board clock generator 100 is equal to Fref, then the output of the PLL 120 is a clock F whose frequency is equal to 2N×Fref. The clock F outputted by the PLL 120 is then inputted to the PLL Output Divider (1/2) 140 which produces an output clock Fcore whose frequency is equal to N×Fref.

As illustrated in FIG. 1, the input reference clock XCLKREF is a constant frequency signal that is generated by the board clock generator 100 and a directly drives the PLL 120 of the processor. The PLL 120 output frequency is a product of the reference clock frequency and the PLL 120 divider ratio and the core frequency bin split is equal to the reference clock frequency. Due to the constant reference frequency, in order to generate higher core frequencies, a higher divider ratio must be used. Increasing the PLL divider ratio (2N) increases the PLL sensitivity to noise due to the decreasing of the PLL damping factor. Because of this, a higher core clock signal jitter occurs at higher core frequencies.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirits and scope of the present invention are limited only by the terms of the appended claims.

The following represents brief descriptions of the drawings, wherein.

DETAILED DESCRIPTION

Figure 1:
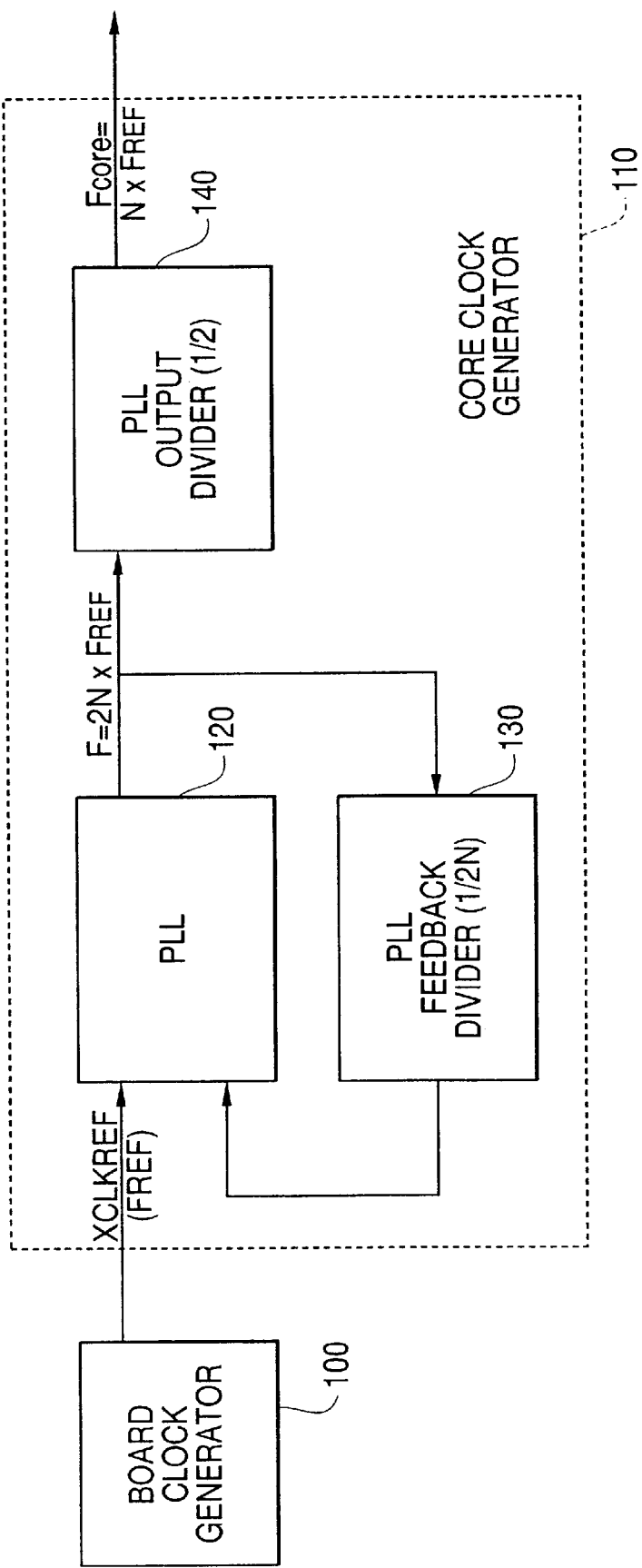
FIG. 1 is a block diagram illustrating an example of a disadvantageous bin split arrangement.

Before beginning a detailed description of the subject invention, mention of the following is in order. When appropriate, like reference numerals and characters may be used to designate identical, corresponding, or similar components in differing drawing figures. Furthermore, in the detailed description to follow, example sizes/models/values/ranges may be given, although the present invention is not limited thereto. As a final note, well-known power connections and the details of well-known components have not been shown within the drawing figures for simplicity of illustration and discussion and so as not to obscure the invention.

Although the present invention will be described below with respect to a tracking bin split arrangement for a high-speed processor, practice of the invention is not limited thereto, that is, the invention may be practiced with elements other than a high-speed processor and in other types of environments.

Figure 2:
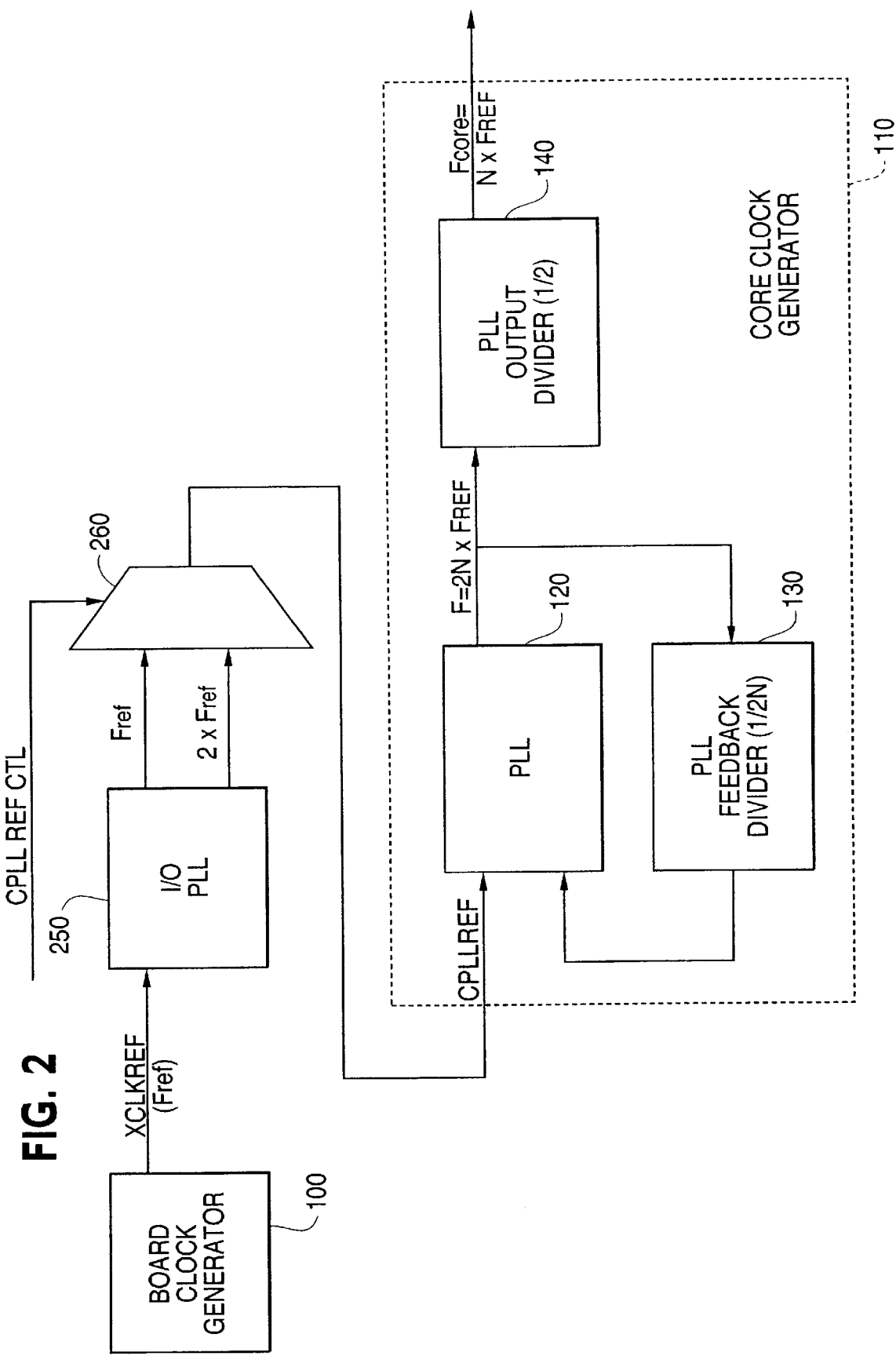
FIG. 2 is a block diagram illustrating an example of a bin split arrangement in accordance with an embodiment of the present invention.

FIG. 2 is a block diagram illustrating an example of a bin split arrangement in accordance with an embodiment of the present invention. As illustrated in FIG. 2, a board clock generator 100, disposed on a motherboard, outputs a clock XCLKREF which is inputted to an I/O PLL 250, contained within a processor chip, for example, disposed on the motherboard. The I/O PLL 250, which is illustrated in greater detail in the block diagram of FIG. 3, has to outputs, namely, one output at a frequency equal to that of the board clock generator 100 and one output at a frequency which is twice that of the board clock generator 100.

The outputs of the I/O PLL 250 are inputted to a multiplexer 260 which is also contained within the processor. The multiplexer 260 is controlled by a control signal CPLL REF CTL so as to output either the I/O PLL 250 clock at a frequency Fref or the I/O PLL 250 clock at a frequency 2×Fref. The output of the multiplexer 260 is inputted to the PLL 120 of the core clock generator 110 contained within the processor.

Figure 3:
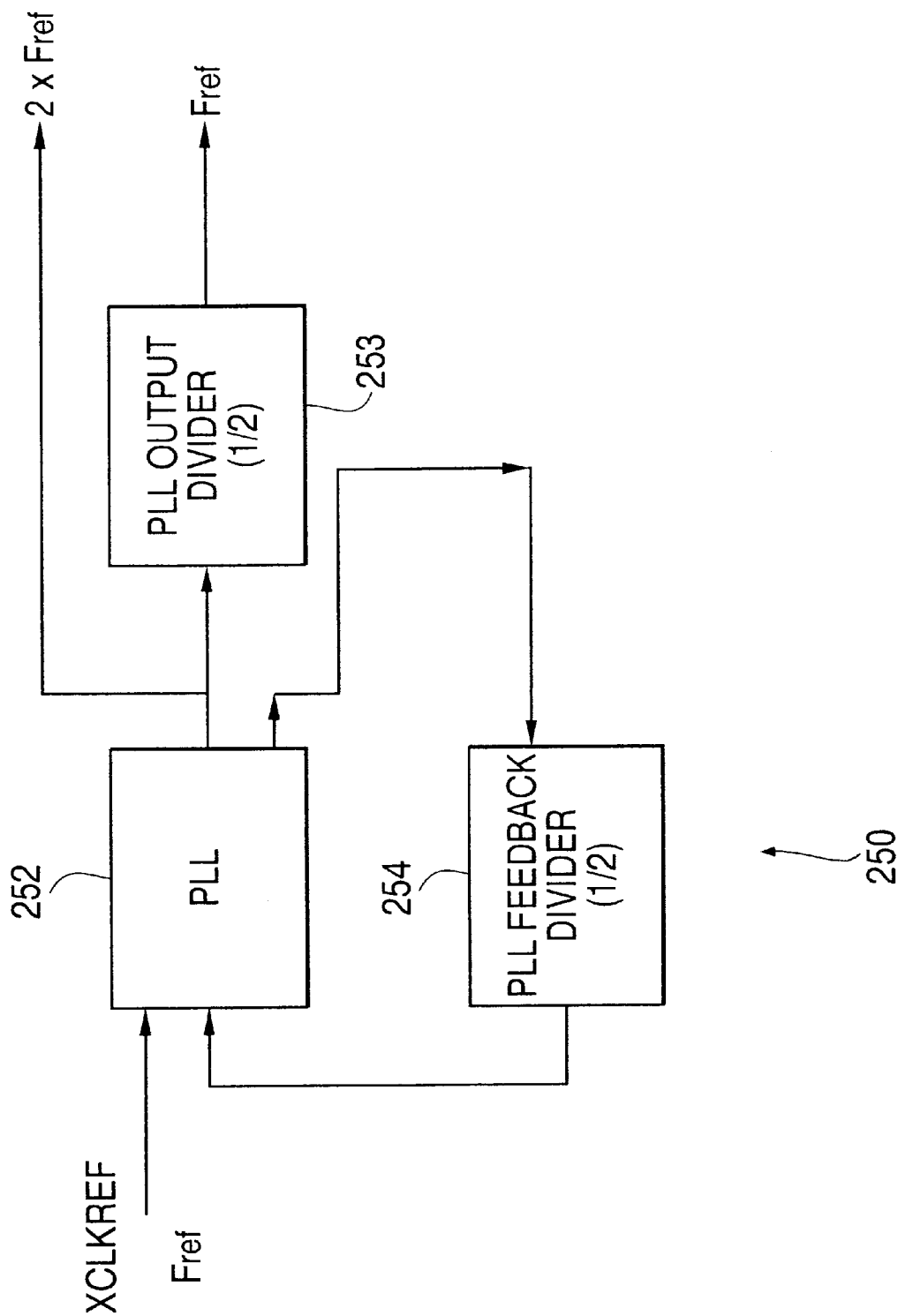
FIG. 3 is a block diagram illustrating an example of the details of the I/O PLL 250 of FIG. 2.

Referring to FIG. 3, the I/O PLL 250 may consist of a PLL 252 having an output which is fed back to an input thereof via a PLL feedback divider (1/2) 254 and a PLL output divider (1/2) 253. It is to be noted that the separate PLL output divider 253 may not in fact be necessary and instead an output from the PLL feedback divider 254 may be used along with the output of the PLL 252.

In operation, referring to FIGS. 2 and 3, the board clock generator 100 generates a clock XCLKREF of a frequency Fref which is inputted to the I/O PLL 250. The I/O PLL 250, which may consist of PLL 252 and PLL feedback divider 254 and optionally PLL output divider 253 produces two clock outputs, namely, a clock output at a frequency of Fref and a clock output and a frequency of 2×Fref.

The two clock outputs of the I/O PLL 250 are inputted to the multiplexer 260 where, in response to the logic level of control signal CPLL REF CTL, a clock output CPLLREF is outputted. The frequency of the clock output CPLLREF is selectively chosen to be either Fref or 2×Fref.

The multiplexer 260 clock output CPLLREF is inputted to the core clock generator 110 where it is converted into a clock output Fcore having a frequency equal to N×Fref in the same fashion as the core clock generator 110 of FIG. 1 discussed above.

In the present invention, the PLL reference frequency is increased at higher core frequencies. The reference frequency will track the rising of the core frequency to lower the core PLL divider ratio at high frequency bins. This reduces the core clock jitter at high core frequencies.

As illustrated in FIG. 2, the I/O PLL 250 internally generates the core PLL reference clock. For example, in the case of next generation high-speed processors, the core PLL reference clock frequency may be chosen to be equal to 100 MHz for low frequency core frequencies of 1600–2000 MHz and may be chosen to be equal to 200 MHz for high frequency core frequencies of 2200–2800 MHz. Thus, when the reference clock frequency is equal to 100, the frequency bin split is equal to 100 MHz and the PLL divider ratio (2N) is in the range of 32–40. On the other hand, when the frequency bin split is equal to 200 MHz, then the PLL divider ratio (2N) is in the range of 22–28.

Figure 4:
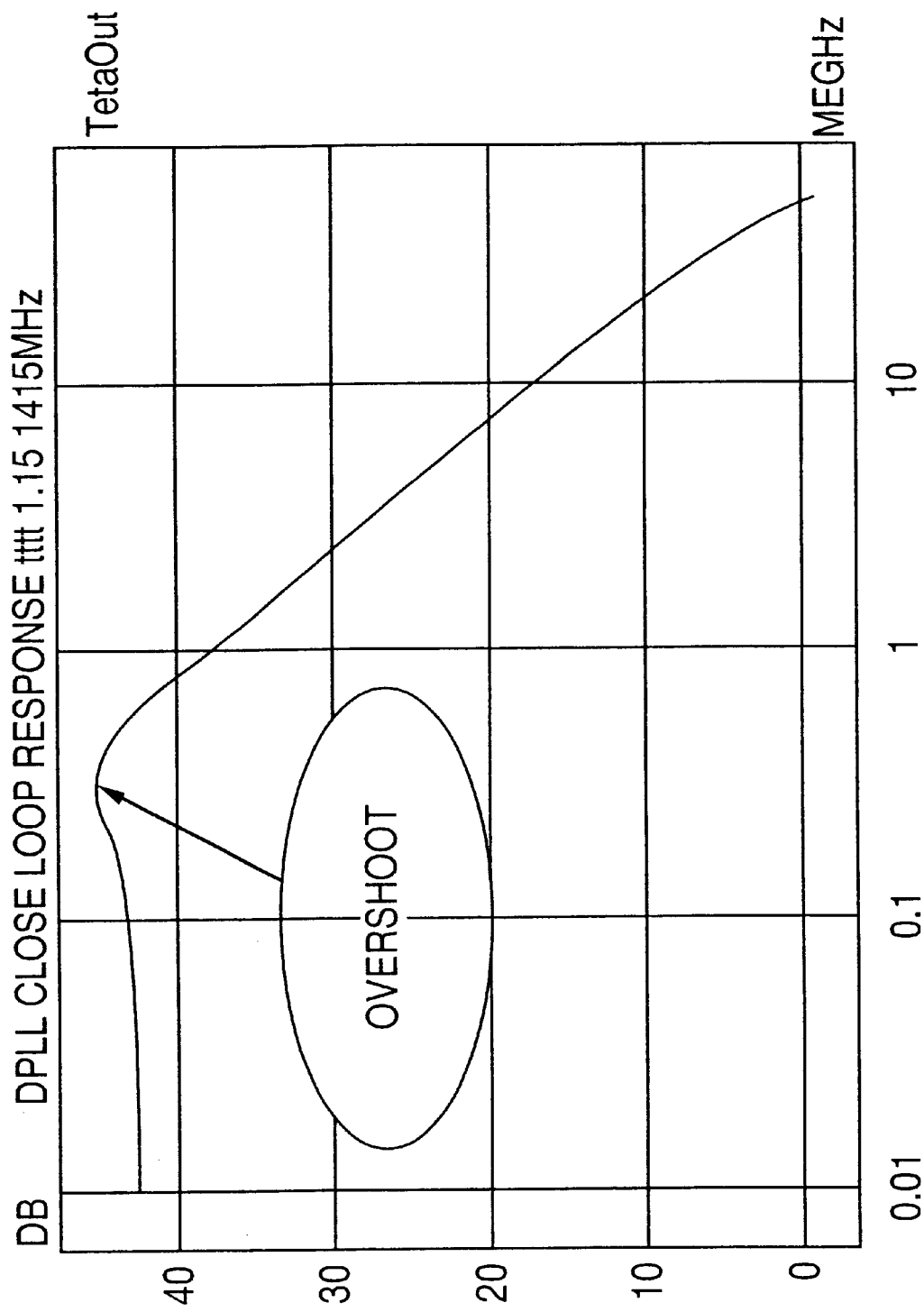
FIG. 4 illustrates the loop frequency domain response of the example of FIG. 2.
Figure 5:
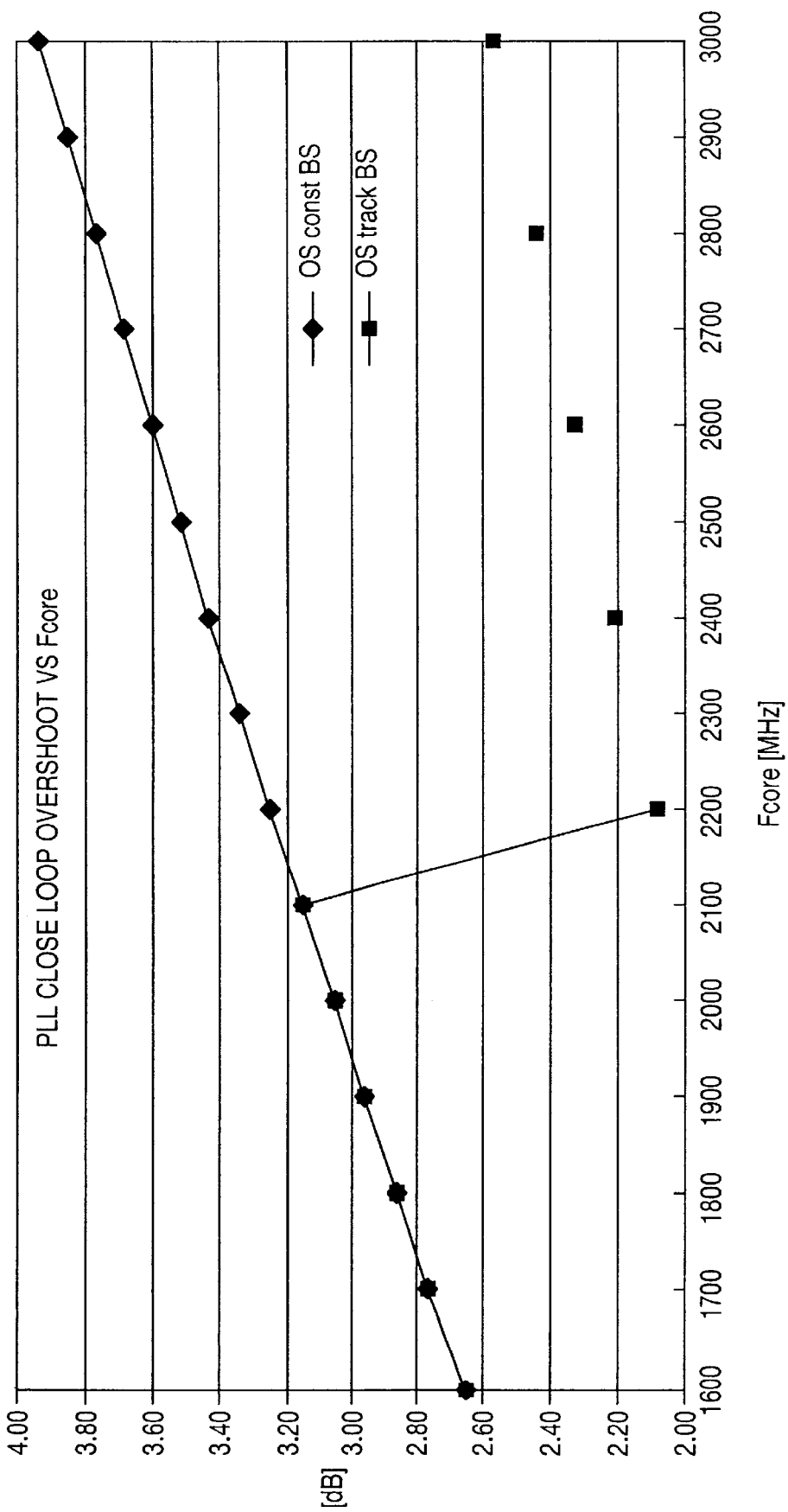
FIG. 5 illustrates the PLL closed loop overshoot vs. core frequency of the example of FIG. 2.

The use of a higher feedback counter divide ratio decreases the PLL damping factor. As illustrated in FIG. 4, the decrease of the PLL damping factor is directly reflected in the increase in the frequency domain loop response overshoot. FIG. 5 illustrates the behavior of the loop overshoot as a function of the core frequency. It can be seen that at a core frequency of 2800 MHz, the use of a 200 MHz reference clock frequency lowers the loop response overshoot by approximately 1.4 dB as compared with the use of a 100 MHz reference clock frequency. Accordingly, a lower core clock signal jitter would be expected.

For example, at a core frequency of 2800 MHz and a loop feedback divider ratio equal to 56, the estimated core clock peak to peak jitter is equal to 60 picoseconds. On the a hand, if a reference frequency of 200 MHz is used, resulting in a loop feedback divider ratio equal to 28, then the estimated core clock peak to peak jitter is equal to 35 picoseconds. Thus, the peak to peak jitter improvement is equal to 25 picoseconds and is the equivalent of 86 MHz increased maximum operating frequency.

Stated differently, if 2N is equal to 56, then the jitter is 60 picoseconds (+/−30 picoseconds). The maximum period then becomes equal to 357 picoseconds +30 picoseconds= 387 picoseconds. This results in a minimum clock frequency equal to 2584 MHz. That is, the maximum chip operation frequency is equal to 2584 MHz.

If, on the other hand, 2N is equal to 28, then the jitter is reduced to 35 picoseconds (+/−17.5 picoseconds). The maximum period then becomes equal to 357 picoseconds+ 17.5 picoseconds=374.5 picoseconds. This results in a minimum clock frequency equal to 2670 MHz that is, the maximum chip operation frequency is equal to 2670 MHz.

Thus, by adjusting the divide ratio, the maximum chip operation frequency is improved by 86 MHz.

It is to be noted that in the example embodiment discussed above, the I/O PLL 250 and its corresponding multiplexer 260 produced only two different reference clock frequencies. It is of course understood that the present invention is not limited thereto but rather, a plurality of reference clock frequencies may be generated by the I/O PLL 250 and selectively chosen by the multiplexer 260, providing that the PLL feedback divider ratio 2N is adjusted accordingly so as to maintain a constant frequency clock outputted by the core clock generator 110.

This concludes the description of the example embodiments. Although the present invention has been described with reference to an illustrative embodiment thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings, and the appended claims without departing from the spirit of the invention. In addition to variations and modifications in the component parts and/or arrangements, alternative uses will also be apparent to those skilled in the art.

For example, the I/O PLL 250 of FIG. 2 may have an entirely different configuration from that of FIG. 3. Furthermore, the present invention is not limited to the use of a single PLL with a single multiplexer but rather may be used with any circuit component which selectively generates a clock which is synchronous with a board clock generator clock input thereto and which is at a frequency equal to that of the board clock generator clock or an integral multiple thereof. Furthermore, the use of the PLL output divider 140 is optional and may be unnecessary in certain arrangements.

What is claimed is:

1. A tracking bin split clock generator apparatus comprising:

a clock generator to receive an externally generated board clock and to selectively generate a reference clock in phase with the externally generated board clock at a frequency equal to that of the externally generated board clock multiplied by M, wherein M is an integer equal to or greater than one;

a phase locked loop to receive the reference clock output by the clock generator and to generate an output clock in phase with the reference clock and having a frequency which is an integral multiple of that of the reference clock; and a PLL (Phase Locked Loop) feedback divider to receive the output clock generated by the phase locked loop and to generate a feedback clock in phase with the output clock and at a frequency equal to that of the output clock divided by 2N, wherein 2N is an even integer equal to or greater than two.

2. The apparatus of claim 1, wherein the clock generator comprises an I/O PLL connected to a multiplexer, the I/O PLL to generate at least two output clock signals in phase with the externally generated board clock and the multiplexer to receive the at least two output clock signals and to selectively output one of the at least two output clock signals as the reference clock.

3. The apparatus of claim 1, further comprising a PLL output divider to receive the output clock generated by the phase locked loop and to generate a divided output clock in phase with the output clock and at a frequency equal to that of the output clock divided by Q, wherein Q is an integer greater than one.

4. The apparatus of claim 1, wherein M is equal to 2.

5. The apparatus of claim 1, wherein 2N is equal to 28.

6. The apparatus of claim 3, wherein Q is equal to 2.

7. A method of generating an output clock, the method comprising:

receiving an externally generated board clock;

selectively generating the reference clock in phase with the externally generated board clock at a frequency equal to that of the externally generated board clock multiplied by M, wherein M is an integer equal to or greater than one;

generating the output clock with a phase locked loop, the output clock being in phase with the reference clock and having a frequency which is an integral multiple of that of the reference clock; and generating a feedback clock for the phase locked loop, the feedback clock being in phase with the output clock and at a frequency equal to that of the output clock divided by 2N, wherein 2N is an even integer equal to or greater than two.

8. The method of claim 7, wherein selectively generating the reference clock comprises generating at least two output clock signals in phase with the externally generated board clock and selectively outputting one of the at least two output clock signals as the reference clock.

9. The method of claim 7, further comprising generating a divided output clock in phase with the output clock and at a frequency equal to that of the output clock divided by Q, wherein Q is an integer greater than one.

10. The method of claim 7, wherein M is equal to 2.

11. The method of claim 7, wherein 2N is equal to 28.

12. The method of claim 9, wherein Q is equal to 2.

13. A system comprising:

a board clock generator to generate a board clock;

a clock generator to receive the board clock and to selectively generate a reference clock in phase with the board clock at a frequency equal to that of the board clock multiplied by M, wherein M is an integer equal to or greater than one;

a phase locked loop to receive the reference clock output by the clock generator and to generate an output clock in phase with the reference clock and having a frequency which is an integral multiple of that of the reference clock; and a PLL (Phase Locked Loop) feedback divider to receive the output clock generated by the phase locked loop and to generate a feedback clock in phase with the output clock and at a frequency equal to that of the output clock divided by 2N, wherein 2N is an even integer equal to or greater than two.

14. The system of claim 13, wherein the clock generator comprises an I/O PLL connected to a multiplexer, the I/O PLL to generate at least two output clock signals in phase with the externally generated board clock and the multiplexer to receive the at least two output clock signals and to selectively output one of the at least two output clock signals as the reference clock.

15. The system of claim 13, further comprising a PLL output divider to receive the output clock generated by the phase locked loop and to generate a divided output clock in phase with the output clock and at a frequency equal to that of the output clock divided by Q, wherein Q is an integer greater than one.

16. The system of claim 13, wherein M is equal to 2.

17. The system of claim 13, wherein 2N is equal to 28.

18. The system of claim 15, wherein Q is equal to 2.

\* \* \* \* \*

UNITED STATES PATENT AND TRADEMARK OFFICE
CERTIFICATE OF CORRECTION

PATENT NO.   : 6,654,899 B2
DATED        : November 25, 2003
INVENTOR(S)  : Eyal Fayneh and Ernest Knoll It is certified that error appears in the above-identified patent and that said Letters Patent is hereby corrected as shown below:

<u>Title page,</u>
Item [75], Inventors, delete "Earnest Knoll" and insert -- Ernest Knoll --, therefor.

Signed and Sealed this

Sixteenth Day of March, 2004

JON W. DUDAS
*Acting Director of the United States Patent and Trademark Office*